(12) United States Patent
Mikage et al.

(10) Patent No.: US 9,425,527 B2
(45) Date of Patent: Aug. 23, 2016

(54) DIFFERENT-PITCH FLAT CABLE CONNECTION STRUCTURE, PITCH-CONVERSION FLAT CABLE, AND METHOD FOR PRODUCING PITCH-CONVERSION FLAT CABLE

(71) Applicant: SUMITOMO ELECTRIC INDUSTRIES, LTD., Osaka-shi, Osaka (JP)

(72) Inventors: Katsunari Mikage, Osaka (JP); Keiji Koyama, Tochigi (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/648,288

(22) PCT Filed: Jun. 23, 2014

(86) PCT No.: PCT/JP2014/066498
§ 371 (c)(1),
(2) Date: May 29, 2015

(87) PCT Pub. No.: WO2015/001994
PCT Pub. Date: Jan. 8, 2015

(65) Prior Publication Data
US 2015/0325937 A1    Nov. 12, 2015

(30) Foreign Application Priority Data

Jul. 1, 2013 (JP) ................. 2013-137906
Feb. 7, 2014 (JP) ................. 2014-021858

(51) Int. Cl.
*H01R 12/78* (2011.01)
*H05K 3/32* (2006.01)
*H05K 1/14* (2006.01)

(52) U.S. Cl.
CPC .............. *H01R 12/78* (2013.01); *H05K 3/321* (2013.01); *H05K 1/147* (2013.01);

(Continued)

(58) Field of Classification Search
CPC ........................................................ H01R 12/78
USPC ..................................... 439/493; 174/117 F
See application file for complete search history.

(56) References Cited

U.S. PATENT DOCUMENTS 3,878,341 A * 4/1975 Balde ..................... H04Q 1/16
174/117 FF
5,085,221 A * 2/1992 Ingebrigtsen .......... A61B 1/267
600/446

(Continued)

FOREIGN PATENT DOCUMENTS

JP         S58-85781 U    6/1983
JP         S62-152369 U   9/1987

(Continued)

*Primary Examiner* — Timothy Thompson
*Assistant Examiner* — Charles Pizzuto
(74) *Attorney, Agent, or Firm* — Drinker Biddle & Reath LLP

(57) ABSTRACT

Provided is a different-pitch flat cable connection structure for connecting a first flat-cable part that includes a plurality of first conductors arranged in a stripe pattern with a first pitch to a second flat-cable part that includes a plurality of second conductors arranged in a stripe pattern with a second pitch smaller than the first pitch, and establishing electrical continuity between the first conductors and the second conductors. The different-pitch flat cable connection structure includes a connection sheet laminated on one surface side of ends of the first conductors and ends of the second conductors in which at least the one surface side of the ends is exposed. The connection sheet includes a base layer, a plurality of third conductors laminated on another surface side of the base layer so as to extend between the first conductors and the corresponding second conductors in a one-to-one relationship, and a plurality of conductive adhesive layers disposed between facing surfaces of the first conductors and the third conductors and between facing surfaces of the second conductors and the third conductors.

13 Claims, 5 Drawing Sheets

(52) U.S. Cl.
CPC ............... *H05K 2201/094* (2013.01); *H05K 2201/09727* (2013.01); *H05K 2201/10378* (2013.01); *H05K 2203/0278* (2013.01)

(56) References Cited

U.S. PATENT DOCUMENTS 5,966,805 A * 10/1999 Akiha .................. H05K 3/4015
29/831

6,753,477 B1 * 6/2004 Sinkunas ............. H01R 12/613
174/117 FF

FOREIGN PATENT DOCUMENTS

| | | |
|---|---|---|
| JP | H05-021927 A | 1/1993 |
| JP | H09-134748 A | 5/1997 |
| JP | 2011-243523 A | 12/2011 |
| JP | 2013-025905 A | 2/2013 |

* cited by examiner

DIFFERENT-PITCH FLAT CABLE CONNECTION STRUCTURE, PITCH-CONVERSION FLAT CABLE, AND METHOD FOR PRODUCING PITCH-CONVERSION FLAT CABLE

TECHNICAL FIELD

The present invention relates to a structure for connecting flat cables having different pitches (different-pitch flat cable connection structure), a pitch-conversion flat cable, and a method for producing a pitch-conversion flat cable.

BACKGROUND ART

Flat cables are used for electrical connections between electrical components of, for example, a circuit board installed in an electronic device. Such flat cables are flexible cables produced by arranging a plurality of flat conductors in a stripe pattern with a constant pitch, interposing the conductors between two insulating films, and covering the resulting product with an insulating coating. Flat cables that include conductors having different widths and different pitches are appropriately used in accordance with the structure of electrical components. It is desirable to standardize the pitch of a flat-cable connection terminal (connector) of an electrical component to be connected in an electronic device. However, a change in the design of existing electrical components increases the cost. Therefore, in some cases, electrical components having different terminal pitches must be connected to each other with a flat cable therebetween.

Japanese Unexamined Patent Application Publication No. 2011-243523 has proposed that, in such a case, a pitch-conversion sheet that converts the pitch of a conductor is connected to an end of a flat cable, and thus the flat cable can be connected to a connector having a different pitch. The pitch-conversion sheet includes a pattern formed on a resin sheet by using a metal foil, the pattern having a plurality of first straight parts arranged at the same pitch as a pitch of the flat cable, a plurality of second straight parts arranged at the same pitch as a pitch of the connector, and a plurality of inclined parts that connect the first straight parts to the corresponding second straight parts in a one-to-one relationship.

CITATION LIST

Patent Literature

PTL 1: Japanese Unexamined Patent Application Publication No. 2011-243523

SUMMARY OF INVENTION

Technical Problem

However, it is necessary that the second straight parts of the above pitch-conversion sheet function as a terminal connected to a connector of an electrical component, and thus the second straight parts must be formed so as to have mechanical properties equivalent to those of the flat cable. Accordingly, the pitch-conversion sheet does not necessarily realize a reduction in cost compared with the case of producing a special flat cable which has conductors arranged so as to change the pitch at a halfway position.

The present invention has been made in view of the above disadvantage. An object of the present invention is to provide a different-pitch flat cable connection structure with which flat cables having different pitches can be connected to each other at a low cost, and a low-cost pitch-conversion flat cable, and a method for producing the pitch-conversion flat cable.

Solution to Problem

An invention made to achieve the above object provides a different-pitch flat cable connection structure for connecting a first flat-cable part that includes a plurality of first conductors arranged in a stripe pattern with a first pitch to a second flat-cable part that includes a plurality of second conductors arranged in a stripe pattern with a second pitch smaller than the first pitch, and establishing electrical continuity between the first conductors and the second conductors, the different-pitch flat cable connection structure including a connection sheet laminated on one surface side of ends of the first conductors and ends of the second conductors in which at least the one surface side of the ends is exposed. In the different-pitch flat cable connection structure, the connection sheet includes a base layer, a plurality of third conductors laminated on another surface side of the base layer so as to extend between the first conductors and the corresponding second conductors in a one-to-one relationship, and a plurality of conductive adhesive layers disposed between facing surfaces of the first conductors and the third conductors and between facing surfaces of the second conductors and the third conductors.

Another invention made to achieve the above object provides a pitch-conversion flat cable including a first flat-cable part that includes a plurality of first conductors arranged in a stripe pattern with a first pitch and a second flat-cable part that includes a plurality of second conductors arranged in a stripe pattern with a second pitch smaller than the first pitch, the first flat-cable part and the second flat-cable part being connected to each other so as to establish electrical continuity between the first conductors and the corresponding second conductors in a one-to-one relationship, in which a connecting part between the first flat-cable part and the second flat-cable part has the above different-pitch flat cable connection structure.

Another invention made to achieve the above object provides a method for producing a pitch-conversion flat cable including a first flat-cable part that includes a plurality of first conductors arranged in a stripe pattern with a first pitch and a second flat-cable part that includes a plurality of second conductors arranged in a stripe pattern with a second pitch smaller than the first pitch, the first conductors and the corresponding second conductors establishing electrical continuity in a one-to-one relationship, the method including a step of superposing a connection sheet on one surface side of the first conductors and the second conductors; and a step of compression-bonding the first conductors and the second conductors to the connection sheet, in which the connection sheet includes a base layer, a plurality of third conductors that are laminated on another surface side of the base layer so as to extend between the first conductors and the second conductors, and a plurality of conductive adhesive layers disposed between facing surfaces of the first conductors and the third conductors and between facing surfaces of the second conductors and the third conductors.

Advantageous Effects of Invention

According to the different-pitch flat cable connection structure of the present invention, flat cables having different pitches can be connected to each other at a low cost. In addition, the different-pitch flat cable connection structure is good in terms of adhesive strength and reliability of electrical

Figure 1:
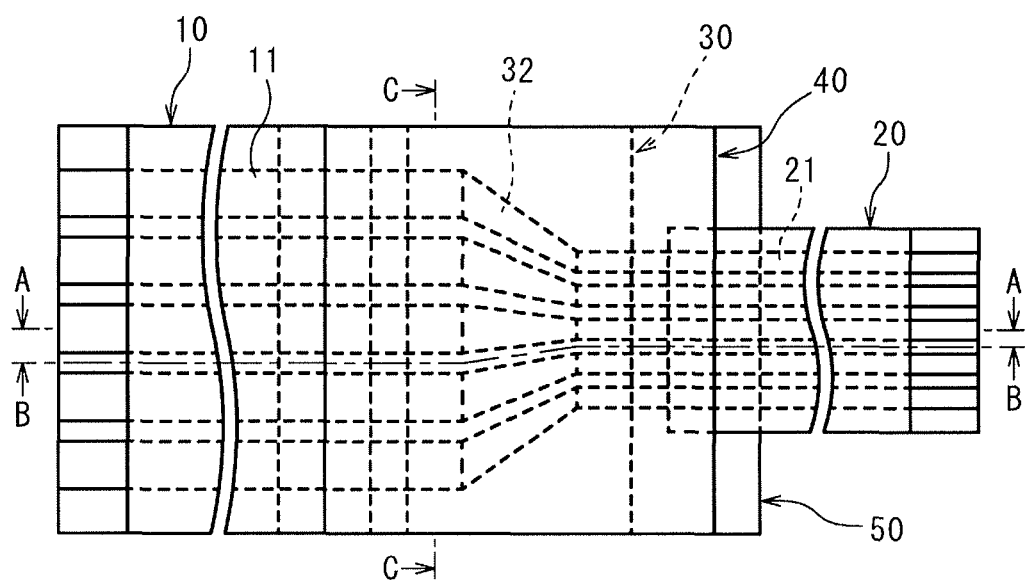
FIG. 1 is a schematic plan view showing a pitch-conversion flat cable having a different-pitch flat cable connection structure according to an embodiment of the present invention.

REFERENCE SIGNS LIST 10 first flat-cable part
11 first conductor
12 flat-cable adhesive layer
13 insulating film
20 second flat-cable part
21 second conductor
22 flat-cable adhesive layer
23 insulating film
30 connection sheet
31 base layer
32 third conductor
33 conductive adhesive layer
40 protective film
41 protective film adhesive layer
50 reinforcement film
51 reinforcement film adhesive layer
P1 first pitch
P2 second pitch
H1 heating unit
H2 heating unit
H3 heating unit
H4 heating unit

DESCRIPTION OF EMBODIMENTS

Description of Embodiments of the Present Invention

A present invention provides a different-pitch flat cable connection structure for connecting a first flat-cable part that includes a plurality of first conductors arranged in a stripe pattern with a first pitch to a second flat-cable part that includes a plurality of second conductors arranged in a stripe pattern with a second pitch smaller than the first pitch, and establishing electrical continuity between the first conductors and the second conductors, the different-pitch flat cable connection structure including a connection sheet laminated on one surface side of ends of the first conductors and ends of the second conductors in which at least the one surface side of the ends is exposed. The connection sheet includes a base layer, a plurality of third conductors laminated on another surface side of the base layer so as to extend between the first conductors and the corresponding second conductors in a one-to-one relationship, and a plurality of conductive adhesive layers disposed between facing surfaces of the first conductors and the third conductors and between facing surfaces of the second conductors and the third conductors.

In the flat cable connection structure, the first flat-cable part is mechanically connected to the second flat-cable part through the connection sheet, and ends of the first flat-cable part and the second flat-cable part, the ends being on the side opposite to the connection sheet, are provided for connection with connectors. Accordingly, since a mechanical strength necessary for terminals is not required for the third conductors of the connection sheet, the third conductors can be formed at a low cost. Since the flat cable connection structure includes the conductive adhesive layers, the third conductors can be electrically connected to the first conductors and the second conductors easily and reliably. Therefore, the flat cable connection structure can be formed at a low cost while the first conductors of the first flat-cable part can be easily and reliably connected to the second conductors of the second flat-cable part.

The third conductors are preferably formed by printing a conductive paste. By forming the third conductors using a printing technique, third conductors having any shape can be accurately formed at a low cost. Therefore, reliability of electrical connection of the flat cable connection structure can be improved at a low cost. In addition, since the third conductors (wirings) can be easily formed by printing, when a design change occurs, the time required for the change can be shortened.

Each of the third conductors preferably has a rectangular first end portion facing the first conductor and having the conductive adhesive layer thereon, a rectangular second end portion facing the second conductor and having the conductive adhesive layer thereon, and a quadrangular connecting portion connecting a side of the first end portion to a side of the second end portion. The rectangular first end portions and the rectangular second end portions can be reliably connected to the first conductors of the first flat-cable part and the second conductors of the second flat-cable part, respectively, each of the first conductors and the second conductors similarly being exposed to form a rectangular shape. Furthermore, when the connecting portions between the first conductors and the second conductors each have a quadrangular shape, the first conductors can be connected to the corresponding second conductors with a minimal distance therebetween so that adjacent connecting portions do not interfere with each other. Thus, the cost can be reduced.

The conductive adhesive layers are preferably formed by printing a solder paste that contains a metal having a low melting point. When the conductive adhesive layers are formed by printing a paste for electrical connection, the conductive adhesive layer can be easily and reliably provided between facing surfaces of the first conductors and the third conductors and between facing surfaces of the second conductors and the third conductors. The paste for electrical connection, the paste being used for forming the conductive adhesive layers, has a low melting point. Accordingly, when the conductive adhesive layers are melted to connect the first and second conductors to the third conductors, the first conductors, the second conductors, and the third conductors do not melt. Thus, a decrease in the mechanical strength can be prevented while reliably establishing electrical connection. The term "low melting point" means that the melting point is 230° C. or less.

Preferably, both surfaces of the first conductors are exposed on an end of the first flat-cable part, both surfaces of the second conductors are exposed on an end of the second flat-cable part, and a protective film is provided on the another surface side of the first conductors and the second conductors so as to cover the connection sheet with an adhesive layer therebetween. By covering the another surface side of the first conductors and the second conductors with a protective film, insulating coating of the first conductors and the second conductors can be easily performed. In this case, the flat cable connection structure can be easily formed, and the adhesive strength of the connection structure can be further enhanced by the adhesive layer laminated on the protective film.

A reinforcement film is preferably provided on the one surface side of the connection sheet with an adhesive layer therebetween. By covering the one surface side of the connection sheet with a reinforcement film, lamination and bonding of the connection structure can be performed in a state where the first flat-cable part, the second flat-cable part, and the connection sheet are fixed to the reinforcement film. In this case, the flat cable connection structure can be easily formed, and adhesive strength of the connection structure can be further enhanced by the adhesive layer laminated on the reinforcement film.

The first conductors and the second conductors each preferably have a projection projecting so as to face the first end portion of the third conductor and the second end portion of the third conductor, respectively, and the conductive adhesive layer preferably fills a gap between the projection and the third conductor. In the different-pitch flat cable connection structure, the first conductors and the second conductors are arranged in a superposed state with the third conductors disposed so as to extend between the first conductors and the second conductors, and the first and second conductors are electrically connected to the corresponding third conductors with the conductive adhesive layers therebetween. Therefore, in the different-pitch flat cable connection structure, these conductors can be connected to each other easily and reliably. In addition, in the different-pitch flat cable connection structure, since the conductive adhesive layers fill the gaps between the projections and other conductors, the adhesive strength and connection reliability between the conductors can be enhanced.

The projection is preferably formed so as to have a spherical surface by a stamping molding method for a sheet-shaped conductor. By forming the projection so as to have a spherical surface by a stamping molding method, the projection can be formed easily and reliably and the adhesive strength and connection reliability between the conductors can be enhanced.

An average projection height of the projection is preferably 0.06 mm or more and 0.2 mm or less. When the average projection height of the projection is within the above range, electrical connection between a pair of conductors can be established more easily and more reliably while maintaining the adhesive strength between the conductors by the conductive adhesive layer.

An average radius of curvature of an inner surface of the projection is preferably 0.1 mm or more and 0.5 mm or less. When the average radius of curvature of an inner surface of the projections is within the above range, electrical connection between the first conductors and the third conductors and between the second conductors and the third conductors can be established more easily and more reliably while maintaining the adhesive strength between these conductors by the conductive adhesive layers.

Another present invention provides a pitch-conversion flat cable including a first flat-cable part that includes a plurality of first conductors arranged in a stripe pattern with a first pitch and a second flat-cable part that includes a plurality of second conductors arranged in a stripe pattern with a second pitch smaller than the first pitch, the first flat-cable part and the second flat-cable part being connected to each other so as to establish electrical continuity between the first conductors and the corresponding second conductors in a one-to-one relationship, in which a connecting part between the first flat-cable part and the second flat-cable part has the above different-pitch flat cable connection structure.

Since the pitch-conversion flat cable has the different-pitch flat cable connection structure, the first conductors of the first flat-cable part are easily and reliably connected to the second conductors of the second flat-cable part with the connection sheet therebetween. Ends of the first flat-cable part and the second flat-cable part, the ends being on the side opposite to the connection sheet, are provided for connection with connectors. Accordingly, since a mechanical strength necessary for terminals is not required for the third conductors of the connection sheet, the cost of the flat cable connection structure can be reduced. Thus, the pitch-conversion flat cable can be provided at a low cost.

An extension direction of the first conductors of the first flat-cable part and an extension direction of the second conductors of the second flat-cable part preferably form an angle. When the first flat-cable part and the second flat-cable part form an angle, the extension direction of the conductors of the pitch-conversion flat cable can be changed in any direction while the pitch is converted.

Another present invention provides a method for producing a pitch-conversion flat cable including a first flat-cable part that includes a plurality of first conductors arranged in a stripe pattern with a first pitch and a second flat-cable part that includes a plurality of second conductors arranged in a stripe pattern with a second pitch smaller than the first pitch, the first conductors and the corresponding second conductors establishing electrical continuity in a one-to-one relationship, the method including a step of superposing a connection sheet on one surface side of the first conductors and the second conductors; and a step of compression-bonding the first conductors and the second conductors to the connection sheet, in which the connection sheet includes a base layer, a plurality of third conductors that are laminated on another surface side of the base layer so as to extend between the first conductors and the second conductors, and a plurality of conductive adhesive layers disposed between facing surfaces of the first conductors and the third conductors and between facing surfaces of the second conductors and the third conductors.

The method for producing a pitch-conversion flat cable provides a pitch-conversion flat cable in which a first flat-cable part is connected to a second flat-cable part with a connection sheet therebetween and ends of the first flat-cable part and the second flat-cable part, the ends being on the side opposite to the connection sheet, are provided for connection with connectors. Accordingly, a strength is not required for the third conductors that electrically connect the first conductors of the first flat-cable part to the second conductors of the second flat-cable part, and thus the pitch-conversion flat cable can be produced at a low cost.

Details of Embodiments of the Present Invention

Different-pitch flat cable connection structures according to embodiments of the present invention will now be described in detail with reference to the drawings.

Figure 5:
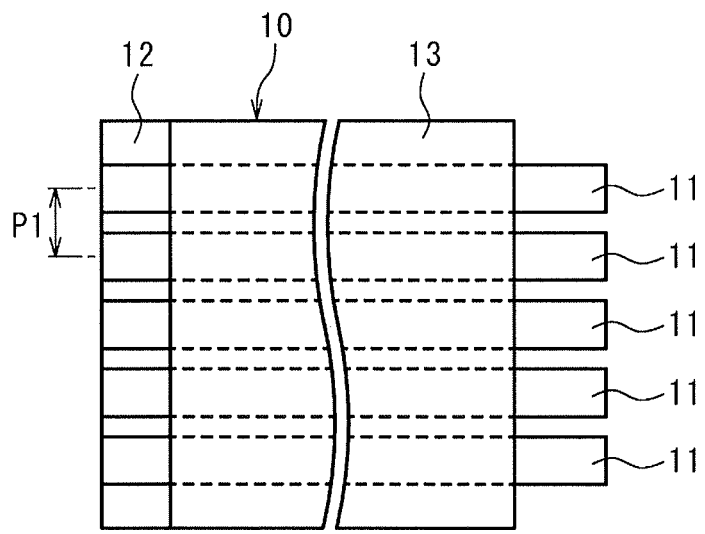
FIG. 5 is a schematic plan view of a first flat-cable part of the pitch-conversion flat cable in FIG. 1.
Figure 6:
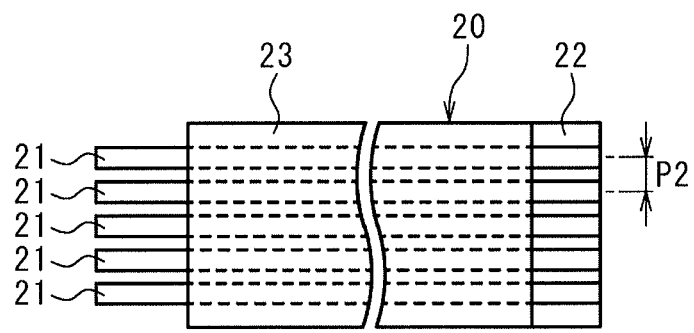
FIG. 6 is a schematic plan view of a second flat-cable part of the pitch-conversion flat cable in FIG. 1.

A different-pitch flat cable connection structure shown in FIGS. 1 to 4 includes a first flat-cable part 10 shown in FIG. 5 and including a plurality of first conductors 11 arranged in a stripe pattern with a first pitch P1, and a second flat-cable part 20 shown in FIG. 6 and including a plurality of second conductors 21 arranged in a stripe pattern with a second pitch P2 smaller than the first pitch P1. The first flat-cable part 10 is connected to the second flat-cable part 20 so as to establish electrical continuity between the first conductors 11 and the corresponding second conductors 21 in a one-to-one relationship.

Figure 7:
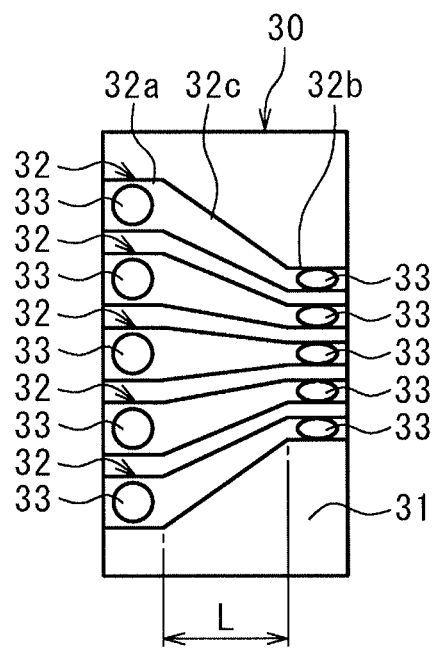
FIG. 7 is a schematic plan view of a connection sheet of the pitch-conversion flat cable in FIG. 1.

The different-pitch flat cable connection structure that connects the first flat-cable part 10 to the second flat-cable part 20 includes a connection sheet 30 shown in FIG. 7 and laminated on a rear surface side of ends of the first conductors 11 and ends of the second conductors 21 that face each other. The different-pitch flat cable connection structure further includes a protective film 40 and a reinforcement film 50. The protective film 40 covers a front surface side of the first conductors 11 and the second conductors 21 with a protective film adhesive layer 41 therebetween. The reinforcement film 50 covers the rear surface side of the connection sheet 30 with a reinforcement film adhesive layer 51 therebetween.

<First Flat-Cable Part>

The first flat-cable part 10 includes a plurality of first conductors 11 that are arranged in a stripe pattern with the first pitch P1, and an insulating film 13 that is laminated on each of a front surface side and a rear surface side of the first conductors 11 with a flat-cable adhesive layer 12 therebetween.

The first conductors 11 are flat conductors arranged in a stripe pattern, and are laminated on the insulating film 13 with the flat-cable adhesive layer 12 therebetween. The first conductors 11 can be formed by using a material having electrical conductivity. In general, the first conductors 11 are formed of, for example, copper.

Surfaces of the first conductors 11 are subjected to a plating treatment, and a plating layer (not shown) is provided on the surfaces. The plating treatment is preferably tin plating, silver plating, or gold plating. The plating treatment can prevent, for example, exposed first conductors 11 from being damaged during a connection operation.

The lower limit of an average thickness (including the plating layer) of the first conductors 11 is preferably 10 µm and more preferably 35 µm. When the average thickness of the first conductors 11 is less than the lower limit, the first conductors 11 may have an insufficient mechanical strength and may be broken. The upper limit of the average thickness (excluding the plating layer) of the first conductors 11 is preferably 100 µm and more preferably 60 µm. When the average thickness of the first conductors 11 exceeds the upper limit, the different-pitch flat cable connection structure may be unnecessarily thick.

The lower limit of an average width (including the plating layer) of the first conductors 11 is preferably 0.1 mm and more preferably 0.2 mm. When the average width of the first conductors 11 is less than the lower limit, the first conductors 11 may have an insufficient mechanical strength and may be broken. The upper limit of the average width of the first conductors 11 is preferably 1.5 mm and more preferably 1.25 mm. When the average width of the first conductors 11 exceeds the upper limit, the different-pitch flat cable connection structure may have an unnecessarily large width. The widths of the first conductors 11 are preferably equal to each other.

The first pitch P1 of the first conductors 11 may be, for example, 0.3 mm or more and 6 mm or less.

The insulating film 13 is constituted by a sheet-like member having flexibility and electrical insulating property. Specifically, a resin film can be used as the insulating film 13. For example, a polyimide resin, a polyethylene terephthalate resin, or the like is suitably used as the material of the resin film.

The lower limit of a softening temperature of the insulating film 13 is preferably 100° C., more preferably 110° C., and still more preferably 120° C. When the softening temperature of the insulating film 13 is less than the lower limit, the insulating film 13 may be softened and deformed during thermocompression bonding of the different-pitch flat cable connection structure. The upper limit of the softening temperature of the insulating film 13 is not particularly limited, but may be, for example, about 200° C. Note that the term "softening temperature" refers to a softening temperature measured in accordance with JIS K7196 (1991).

The lower limit of a glass transition temperature of the insulating film 13 is preferably 50° C., more preferably 60° C., and still more preferably 65° C. When the glass transition temperature of the insulating film 13 is less than the lower limit, the insulating film 13 may have an insufficient strength after thermocompression bonding of the different-pitch flat cable connection structure. The upper limit of the glass transition temperature of the insulating film 13 is not particularly limited, but may be, for example, about 200° C. Note that the term "glass transition temperature" refers to a midpoint glass transition temperature measured in accordance with JIS K7121 (1987).

The lower limit of an average thickness of the insulating film 13 is preferably 5 µm and more preferably 10 µm. When the average thickness of the insulating film 13 is less than the lower limit, the insulating film 13 may have an insufficient strength. The upper limit of the average thickness of the insulating film 13 is preferably 40 µm and more preferably 20 µm. When the average thickness of the insulating film 13 exceeds the upper limit, the different-pitch flat cable connection structure may be unnecessarily thick.

An adhesive constituting the flat-cable adhesive layer 12 is not particularly limited but is preferably an adhesive having good flexibility and good heat resistance. Examples of the adhesive include adhesives composed of a resin such as an epoxy resin, a polyimide resin, a polyester resin, a phenol resin, a polyurethane resin, an acrylic resin, a melamine resin, or a polyamide-imide resin. Among these, an adhesive composed of a thermoplastic resin having a lower softening temperature and a lower glass transition temperature than the insulating film 13 and a base layer 31 of a connection sheet 30 described below is preferable.

The lower limit of a softening temperature of the flat-cable adhesive layer 12 is preferably 80° C., more preferably 90° C., and still more preferably 100° C. When the softening temperature of the flat-cable adhesive layer 12 is less than the lower limit, the first flat-cable part 10 may be softened and deformed in a thermocompression bonding step of the different-pitch flat cable connection structure. The upper limit of the softening temperature of the flat-cable adhesive layer 12 is not particularly limited, but may be, for example, about 200° C.

The lower limit of a glass transition temperature of the flat-cable adhesive layer 12 is preferably 50° C., more preferably 60° C., and still more preferably 70° C. When the glass transition temperature of the flat-cable adhesive layer 12 is less than the lower limit, the different-pitch flat cable connection structure may have an insufficient strength after thermocompression bonding. The upper limit of the glass transition temperature of the flat-cable adhesive layer 12 is not particularly limited, but may be, for example, about 200° C.

An average thickness of the flat-cable adhesive layer 12 (average distance between the insulating film 13 and the first conductor 11) is preferably 5 μm and more preferably 10 μm. When the average thickness of the flat-cable adhesive layer 12 is less than the lower limit, the adhesive strength between the insulating film 13 and the first conductors 11 may be insufficient. The upper limit of the average thickness of the flat-cable adhesive layer 12 is preferably 50 μm and more preferably 40 μm. When the average thickness of the flat-cable adhesive layer 12 exceeds the upper limit, the different-pitch flat cable connection structure may be unnecessarily thick.

Figure 2:
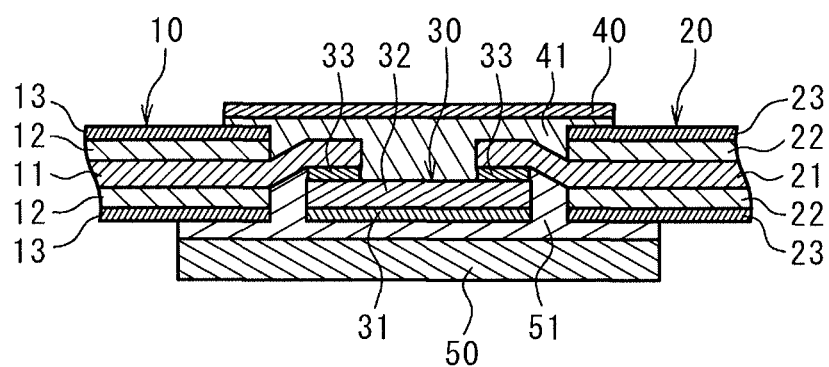
FIG. 2 is a schematic cross-sectional view taken along line A-A in FIG. 1.
Figure 3:
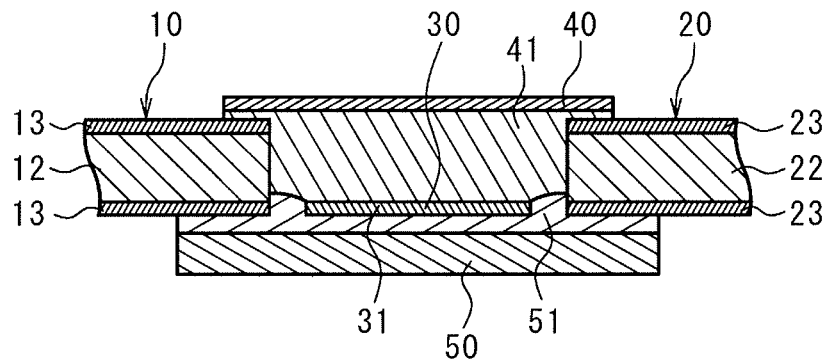
FIG. 3 is a schematic cross-sectional view taken along line B-B in FIG. 1.
Figure 4:
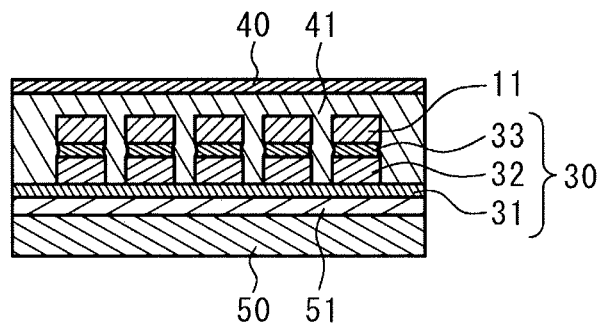
FIG. 4 is a schematic cross-sectional view taken along line C-C in FIG. 1.

Regarding the first flat-cable part 10, in a region (hereinafter, also referred to as an "overlap region") where the first flat-cable part 10 overlaps with third conductors 32 of a connection sheet 30 described below, both surfaces of each of the first conductors 11 on a surface side facing a third conductor 32 and on a surface side opposite to the surface are exposed. The connection sheet 30 is laminated on the rear surface side of the overlap region where the first conductors 11 are exposed. As shown in FIG. 2, due to the overlapping with the connection sheet 30, each of the first conductors 11 in the overlap region is once bent to the front surface side toward an end of the conductor, bent again so as to be parallel to or substantially parallel to the corresponding third conductor 32, and connected to the third conductor 32 with a conductive adhesive layer 33, which will be described below, therebetween.

The upper limit of an average length of the exposed portions of the first conductors 11 is preferably 5 mm and more preferably 2 mm. When the average length of the exposed portions of the first conductors 11 exceeds the upper limit, the pitch of the conductors becomes uneven easily, the positional accuracy with the third conductors 32 of the connection sheet 30 decreases, and electrical connection may not be sufficiently established. The lower limit of the average length of the exposed portions of the first conductors 11 is preferably 0.2 mm and more preferably 0.5 mm. When the average length of the exposed portions of the first conductors 11 is less than the lower limit, electrical connection between the first conductors 11 and the corresponding third conductors 32 may not be sufficiently established.

Each of the first conductors 11 may have a projection projecting so as to face a first end portion of the third conductor 32. In this case, these conductors can be connected to each other easily and reliably. In addition, in this different-pitch flat cable connection structure, a conductive adhesive layer fills the gap between the projection and the other conductor, and thus the adhesive strength and connection reliability between the conductors can be enhanced.

The projection is formed by a stamping molding method for a sheet-shaped conductor so as to have a spherical surface. Specifically, a heat tool having a cushion on a lower surface thereof and a die having a projection on a surface thereof are used, and a projection can be formed by pressing the first conductor 11 onto the surface of the die with the heat tool.

The lower limit of an average projection height of the projections is preferably 0.06 mm and more preferably 0.1 mm. The upper limit of the average projection height of the projections is preferably 0.2 mm and more preferably 0.15 mm. When the average projection height of the projections is less than the lower limit, a space in which solder is retained, the space being formed between the third conductor 32 and the first conductor 11, is small, and thus connection reliability may decrease. When the average projection height of the projections exceeds the upper limit, the distance between the first conductor 11 and the third conductor 32 is large, and the adhesive strength may decrease.

The lower limit of an average radius of curvature R of the projections is preferably 0.1 mm and more preferably 0.15 mm. The upper limit of the average radius of curvature R of the projections is preferably 0.5 mm and more preferably 0.45 mm. When the average radius of curvature R of the projections is less than the lower limit, the connection area between the first conductor 11 and the third conductor 32 is small, and thus connection reliability may decrease. When the average radius of curvature R of the projections exceeds the upper limit, a space in which solder is retained, the space being formed between the first conductor 11 and the third conductor 32, is small, and thus connection reliability may decrease.

<Second Flat-Cable Part>

The second flat-cable part 20 includes a plurality of second conductors 21 that are arranged in a stripe pattern and an insulating film 23 that is laminated on each of a front surface side and a rear surface side of the second conductors 21 with a flat-cable adhesive layer 22 therebetween. The second conductors 21, the insulating film 23, and the flat-cable adhesive layer 22 may be substantially the same as the first conductors 11, the insulating film 13, and the flat-cable adhesive layer 12 of the first flat-cable part 10, respectively.

However, the second pitch P2 of the second conductors 21 is smaller than the first pitch P1 of the first conductors 11. Therefore, the second pitch P2 of the second conductors 21 may be, for example, 0.2 mm or more and 5 mm or less. The widths of the second conductors 21 are preferably equal to each other.

Regarding the second flat-cable part 20, as in the first flat-cable part 10, in an overlap region where the second flat-cable part 20 overlaps with the third conductors 32 of the connection sheet 30, the insulating film and the adhesive layer are not laminated on both surface sides, and both surfaces of each of the second conductors 21 on a surface side facing the third conductor 32 and on a surface side opposite to the surface are exposed. The connection sheet 30 is laminated on the rear surface side of the overlap region where the second conductors 21 are exposed. Each of the second conductors 21 in the overlap region has a shape symmetric with the first conductor 11 in the longitudinal direction. That is, similarly to the first conductors 11, as shown in FIG. 2, due to the overlapping with the connection sheet 30, each of the second conductors 21 in the overlap region is once bent to the front surface side toward an end of the conductor, bent again so as to be parallel to or substantially parallel to the corresponding third conductor 32, and connected to, the third conductor 32 with the conductive adhesive layer 33, which will be described below, therebetween on the side opposite to the side on which the first conductors 11 are connected in the longitudinal direction. An average length of the exposed portions of the second conductors 21 may be the same as that of the first conductors 11.

As described above, since the first conductors 11 and the second conductors 21 are deformed in a bending manner, the first conductors 11 are electrically connected to the second conductors 21 in such a manner that the third conductors 32 extend between the first conductors 11 and the second conductors 21. This structure suppresses expansion of the different-pitch flat cable connection structure and contributes to a reduction in thickness and planarization of the different-pitch flat cable connection structure.

Furthermore, as in the first conductors 11, each of the second conductors 21 may also have a projection projecting so as to face a second end portion of the third conductor 32. In this case, these conductors can be connected to each other easily and reliably. In addition, in this different-pitch flat cable connection structure, a conductive adhesive layer fills the gap between the projection and the other conductor, and thus the adhesive strength and connection reliability between the conductors can be enhanced.

<Connection Sheet>

The connection sheet 30 includes a base layer 31, a plurality of third conductors 32, and a plurality of conductive adhesive layers 33. The third conductors 32 are laminated on a front surface side of the base layer 31 and arranged on a rear surface side between ends of the plurality of first conductors 11 of the first flat-cable part 10 and the plurality of second conductors 21 of the second flat-cable part 20 so as to extend between the first conductors 11 and the corresponding second conductors 21 in a one-to-one relationship. The conductive adhesive layers 33 are arranged between facing surfaces of the first conductors 11 and the third conductors 32 and between facing surfaces of the second conductors 21 and the third conductors 32. That is, the connection sheet 30 includes the plurality of third conductors 32 arranged on the front surface of the base layer 31 in a stripe pattern, and the plurality of conductive adhesive layers 33 arranged in the vicinity of both ends of a surface of the third conductors 32.

The base layer 31 may be a layer the same as the insulating film 13 of the first flat-cable part 10. The lower limit of an average thickness of the base layer 31 is preferably 5 μm and more preferably 10 μm. When the average thickness of the base layer 31 is less than the lower limit, the different-pitch flat cable connection structure may have an insufficient strength, and it may become difficult to produce the different-pitch flat cable connection structure. The upper limit of the average thickness of the base layer 31 is preferably 100 μm and more preferably 80 μm. When the average thickness of the base layer 31 exceeds the upper limit, the different-pitch flat cable connection structure may be unnecessarily thick.

As the material of the third conductors 32, a material the same as that of the first conductors 11 of the first flat-cable part 10 may also be used. However, the third conductors 32 are preferably formed by using a conductive paste. When a conductive paste is used, the third conductors 32 having a desired shape can be accurately formed at a low cost by using a printing technique or the like.

A paste prepared by dispersing conductive particles such as metal particles in a binder can be used as the conductive paste.

Examples of the metal particles include particles of silver, platinum, gold, copper, nickel, palladium, solder, or the like. These metal powders may be used alone or as a mixture of two or more powders. Among these, a silver powder, a silver-coated copper powder, a solder powder, and the like, which exhibit good electrical conductivity, are preferable. For example, the conductive paste disclosed in Japanese Unexamined Patent Application Publication No. 2007-66824 can be suitably used as a conductive paste containing a silver powder.

The lower limit of a content of conductive particles of the conductive paste used for forming the third conductors 32 is preferably 40% by volume and more preferably 45% by volume. When the content of the conductive particles is less than the lower limit, an electrical connection property between conductors may decrease. The upper limit of the content of conductive particles of the conductive paste used for forming the third conductors 32 is preferably 95% by volume and more preferably 85% by volume. When the content of conductive particles of the conductive paste exceeds the upper limit, the fluidity of the conductive paste decreases, and it may become difficult to form the third conductors 32.

Examples of the binder include epoxy resins, phenol resins, polyester resins, polyurethane resins, acrylic resins, melamine resins, polyimide resins, and polyamide-imide resins. One or more of these resins can be used. Among these resins, thermosetting resins that can improve heat resistance of the conductive paste are preferable, and epoxy resins are particularly preferable.

Examples of the epoxy resins used in the conductive paste include epoxy resins of bisphenol A-type, F-type, S-type, or AD-type, copolymers of bisphenol A-type and bisphenol F-type epoxy resins, epoxy resins of naphthalene-type, novolac-type, biphenyl-type, or dicyclopentadiene-type, and phenoxy resins which are high-molecular-weight epoxy resins.

The binder may be dissolved in a solvent and used. Examples of the solvent include organic solvents such as esters, ethers, ketones, ether esters, alcohols, hydrocarbons, and amines. One or more of these solvents can be used. In the case where the third conductors 32 are formed by printing a conductive paste, high-boiling point solvents having good printability are preferably used. Specifically, carbitol acetate, butyl carbitol acetate, and the like are preferably used. Such high-boiling point solvents preferably have a boiling point of 200° C. or more.

A curing agent may be further added to the binder. Examples of the curing agent include amine-based curing agents, polyaminoamide-based curing agents, isocyanate-based curing agents, acid and acid anhydride-based curing agents, basic active hydrogen compounds, tertiary aminos, and imidazoles.

In addition to the above components, auxiliary agents such as a thickener and a leveling agent may be added to the conductive paste. The conductive paste is obtained by mixing the above components by using, for example, a three-roll mill, a rotary stirring and defoaming apparatus, or the like.

The shape of each of the third conductors 32 preferably includes a rectangular first end portion 32a facing the exposed portion of an end of the first conductor 11, a rectangular second end portion 32b facing the exposed portion of an end of the second conductor 21, and a quadrangular connecting portion 32c formed by connecting a side on the second conductor 21 side of the first end portion 32a and a side on the first conductor 11 side of the second end portion 32b. The conductive adhesive layers 33 are formed on the first end portion 32a and the second end portion 32b.

By forming each of the third conductors 32 so that a value determined by dividing the length thereof by the cross-sectional area becomes uniform, the electrical resistances of the third conductors 32 become equal to each other. The lower limit of a gap between the third conductors 32 is preferably 50

μm and more preferably 100 μm. When the gap between the third conductors 32 is less than the lower limit, short-circuit may be caused by, for example, bleeding of printing in a step of forming the conductive adhesive layers.

The first end portions 32a of the third conductors 32 are arranged at a pitch equal to the first pitch P1 of the first conductors 11. The second end portions 32b of the third conductors 32 are arranged at a pitch equal to the second pitch P2 of the second conductors 21. In order to achieve good electrical connection between the first conductors 11 and the second conductors 21, preferably, the lengths of the first end portion 32a and the second end portion 32b are equal to or substantially equal to the lengths of the exposed portions of the first conductor 11 and the second conductor 21, respectively. The lower limit of each of a width and a length of the first end portion 32a and the second end portion 32b is preferably 0.2 mm and more preferably 0.5 mm. When the width or the length of the first end portion 32a and the second end portion 32b is less than the lower limit, electrical connection between the third conductor 32 and the first conductor 11 and between the third conductor 32 and the second conductor 21 may be insufficient. The upper limit of each of the width and the length of the first end portion 32a and the second end portion 32b is preferably 5 mm and more preferably 2 mm. When the width or the length of the first end portion 32a and the second end portion 32b exceeds the upper limit, the different-pitch flat cable connection structure may be unnecessarily long and the mechanical strength may decrease.

A length L of the connecting portion 32c of the third conductor 32 (gap between the first end portion 32a and the second end portion 32b in a conductor longitudinal direction) is selected such that the gap between adjacent third conductors 32 becomes an appropriate value. The lower limit of the length L is preferably 1 mm and more preferably 5 mm. When the length L is less than the lower limit, a sufficient gap between adjacent third conductors 32 may not be provided. The upper limit of the length L is preferably 30 mm and more preferably 25 mm. When the length L exceeds the upper limit, the different-pitch flat cable connection structure may be unnecessarily long.

The lower limit of a gap between adjacent connecting portions 32c is preferably 0.05 mm and more preferably 0.1 mm. When the gap between the adjacent connecting portions 32c is less than the lower limit, adjacent connecting portions 32c may contact each other and short-circuit may occur.

The lower limit of an average height of the third conductors 32 is preferably 5 μm and more preferably 10 μm. When the average height of the third conductors 32 is less than the lower limit, electrical continuity between the first conductors 11 and the second conductors 21 may be insufficient. The upper limit of the average height of the third conductors 32 is preferably 100 μm and more preferably 80 μm. When the average height of the third conductors 32 exceeds the upper limit, the different-pitch flat cable connection structure may be unnecessarily thick. Note that the term "average height of third conductors 32" refers to an average of the maximum heights of a plurality of third conductors 32.

The plurality of conductive adhesive layers 33 are disposed on the first end portion 32a and the second end portion 32b of each of the third conductors 32, that is, disposed between facing surfaces of the first conductor 11 and the third conductor 32 and between facing surfaces of the second conductor 21 and the third conductor 32. The planar shape of each of the conductive adhesive layers 33 is not particularly limited, and may be any shape such as a circular shape or a rectangular shape. The conductive adhesive layers 33 are each preferably formed so as to spread over the entire facing surfaces between the first conductor 11 and the third conductor 32 and the entire facing surfaces between the second conductor 21 and the third conductor 32 in the resulting pitch-conversion flat cable.

The material of the conductive adhesive layers 33 is not particularly limited as long as the material has electrical conductivity. A low-melting-point paste for electrical connection whose shape can be freely changed at room temperature or by slightly heating can be suitably used. By using such a paste for electrical connection, the conductive adhesive layers 33 can be reliably formed on the surfaces of the third conductors 32 of the connection sheet 30 at a low cost by using, for example, a printing technique. A paste for electrical connection, the paste having a lower melting point than at least the first conductors 11, the second conductors 21, and the third conductors 32, may be used as the material of the conductive adhesive layers 33, and the conductive adhesive layers 33 may be heated through the first conductors 11 or the second conductors 21. In this case, the first conductors 11 and the second conductors 21 can be connected to the third conductors 32 by melting only the conductive adhesive layers 33 without deforming and damaging the base layer 31 and the third conductors 32.

Examples of the paste for electrical connection that can be used include conductive adhesives prepared by dispersing conductive particles such as metal particles in an adhesive, and solder pastes prepared by kneading a metal powder (which is not limited to a lead-tin alloy) having a low melting point with a flux.

Examples of the metal particles of the conductive adhesive include particles of silver, platinum, gold, copper, nickel, palladium, indium, tin, solder, or the like. These may be used alone or as a mixture of two or more metal powders. Among these, a silver powder, a silver-coated copper powder, a solder powder, and the like, which exhibit good electrical conductivity, are preferable. The adhesive contained in the conductive adhesive is preferably, for example, a tacky adhesive or a thermoplastic resin having a low melting point, the tacky adhesive and the thermoplastic resin being capable of easily spreading between facing surfaces of the first conductors 11 and the third conductors 32 and between facing surfaces of the second conductors 21 and the third conductors 32. Thermosetting resins may be used as the adhesive contained in the conductive adhesive. However, it is necessary that attention be paid so that the adhesive is not cured in a step prior to the connection between the first conductors 11 and the third conductors 32 and between the second conductors 21 and the third conductors 32.

The metal powder (solder) contained in the solder paste is preferably one having a low melting point. An example thereof is a tin-bismuth alloy having a melting point of 139° C. The metal powder of the solder paste preferably has a particle size of 20 to 40 μm. When solder is melted, the solder spreads between facing surfaces of the first conductors 11 and the third conductors 32 and between facing surfaces of the second conductors 21 and the third conductors 32 due to its wettability, thus improving reliability of electrical connection between the first conductors 11 and the third conductors 32 and between the second conductors 21 and the third conductors 32. The flux contained in the solder paste is preferably one that can contribute to wettability of the solder. Resin-based fluxes, organic acid-based fluxes, or inorganic acid-based fluxes can be used.

In the different-pitch flat cable connection structure (after the connection between the first conductors 11 and the third conductors 32 and between the second conductors 21 and the third conductors 32), the lower limit of an average width of the conductive adhesive layers 33 in the conductor longitudinal direction is preferably 0.2 mm and more preferably 0.3 mm. When the average width of the conductive adhesive layers 33 in the conductor longitudinal direction is less than the lower limit, electrical continuity with the first conductors 11 or the second conductors 21 may be insufficient. The upper limit of the average width of the conductive adhesive layers 33 in the conductor longitudinal direction is preferably 2 mm and more preferably 1.5 mm. When the average width of the conductive adhesive layers 33 in the conductor longitudinal direction exceeds the upper limit, a first conductor 11 or second conductor 21 and a conductive adhesive layer 33 that should not establish electrical continuity may be connected to each other to establish electrical continuity. Furthermore, an adhesive strength of the different-pitch flat cable connection structure may be insufficient due to a decrease in the amount of adhesive provided around the conductors. Furthermore, the cost of the material of the conductive adhesive layers 33 may be unnecessarily high.

In the different-pitch flat cable connection structure, a width of the conductive adhesive layers 33 in the conductor lateral direction (width direction) is preferably the same or substantially the same as an average width of the first end portions 32a or the second end portions 32b. Specifically, the average width of the conductive adhesive layers 33 in the conductor lateral direction is preferably 80% or more and 100% or less of the average width of the first end portions 32a or the second end portions 32b. When the average width of the conductive adhesive layers 33 in the conductor lateral direction is less than the lower limit, electrical continuity with the first conductors 11 or the second conductors 21 may be insufficient. When the average width of the conductive adhesive layers 33 in the conductor lateral direction exceeds the upper limit, a first conductor 11 or second conductor 21 and a conductive adhesive layer 33 that should not establish electrical continuity may be connected to each other to establish electrical continuity.

In the different-pitch flat cable connection structure, the lower limit of the average height of the conductive adhesive layers 33 after the connection between the first conductors 11 and the third conductors 32 and between the second conductors 21 and the third conductors 32 is preferably 10 μm and more preferably 20 μm. When the average height of the conductive adhesive layers 33 is less than the lower limit, electrical continuity and adhesive strength with the first conductors 11 or the second conductors 21 may be insufficient. The upper limit of the average height of the conductive adhesive layers 33 is preferably 100 μm and more preferably 80 μm. When the average height of the conductive adhesive layers 33 exceeds the upper limit, the different-pitch flat cable connection structure may be unnecessarily thick. Note that the term "average height of conductive adhesive layers 33" refers to an average of the maximum heights of the conductive adhesive layers 33.

<Method for Producing Connection Sheet>

The connection sheet 30 can be produced by, for example, the following method.

First, a plurality of third conductors 32 are formed on a surface of a base layer 31 by printing a conductive paste. The method for printing the conductive paste is not particularly limited. For example, screen printing, gravure printing, offset printing, flexo printing, ink jet printing, dispenser printing, or the like can be employed. After the printing of the conductive paste, the conductive paste is preferably dried, for example, at a temperature of 70° C. to 90° C. for about 10 to 60 minutes so as to stabilize the shape of the third conductors 32.

Subsequently, conductive adhesive layers 33 are formed on first end portions 32a and second end portions 32b of the third conductors 32 by printing a solder paste. The method for printing the solder paste is also not particularly limited. For example, screen printing, gravure printing, offset printing, flexo printing, ink jet printing, dispenser printing, or the like can be employed.

Preferably, printing areas of the conductive adhesive layers 33 are slightly smaller than the first end portions 32a and the second end portions 32b so as to prevent the conductive adhesive layers 33 from projecting from the first end portions 32a and the second end portions 32b. For example, a margin to an edge of each of the first end portions 32a and the second end portions 32b is 50 to 100 μm. In order to realize the preferable height of the conductive adhesive layers 33 after the connection between the first conductors 11 and the third conductors 32 and between the second conductors 21 and the third conductors 32, the average height of the conductive adhesive layers 33 after the printing is, for example, 100 μm in consideration of the decrease in the height due to expansion (flattening) in bonding.

<Protective Film>

The protective film 40 is an insulating film laminated on the front surface side of the first conductors 11 and the second conductors 21 so as to cover the connection sheet 30 with the protective film adhesive layer 41 therebetween.

The material of the protective film 40 may be the same as the material of the insulating films 13 of the first flat-cable part 10. The average thickness of the protective film 40 may also be the same as that of the insulating films 13 of the first flat-cable part 10.

The material and the average thickness of the protective film adhesive layer 41 may be the same as those of the flat-cable adhesive layers 12 of the first flat-cable part 10. The protective film adhesive layer 41 preferably has a softening temperature and a glass transition temperature lower than those of the base layer 31 of the connection sheet 30.

The upper limit of the softening temperature of the protective film adhesive layer 41 is preferably 150° C., more preferably 140° C., and still more preferably 130° C. When the softening temperature of the protective film adhesive layer 41 exceeds the upper limit, it is necessary to increase the temperature during thermocompression bonding of the different-pitch flat cable connection structure, and thus productivity may decrease. In the case where the softening temperature of the protective film adhesive layer 41 is less than the melting point of the conductive adhesive layers 33, when the first conductors 11 and the second conductors 21 are connected to the third conductors 32 with the conductive adhesive layers 33 therebetween and the protective film adhesive layer 41 is then attached, it is possible to eliminate the risk of the occurrence of connection defects between the first conductors 11 and the third conductors 32 and between the second conductors 21 and the third conductors 32 due to remelting of the conductive adhesive layers 33. The lower limit of the softening temperature of the protective film adhesive layer 41 is preferably 50° C. and more preferably 60° C. When the softening temperature of the protective film adhesive layer 41 is less than the lower limit, heat resistance (strength retention property at high temperature) of the different-pitch flat cable connection structure may be insufficient.

The upper limit of the glass transition temperature of the protective film adhesive layer 41 is preferably 130° C., more preferably 120° C., and still more preferably 110° C. When the glass transition temperature of the protective film adhesive layer 41 exceeds the upper limit, the different-pitch flat cable connection structure may have an insufficient adhesive strength. The lower limit of the glass transition temperature of the protective film adhesive layer 41 is preferably −20° C. and more preferably −10° C. When the glass transition temperature of the protective film adhesive layer 41 is less than the lower limit, heat resistance (strength retention property at high temperature) of the different-pitch flat cable connection structure may be insufficient.

The upper limit of a minimum distance from the front surface of the first conductors 11 to the rear surface of the protective film 40 is preferably 50 μm and preferably 35 μm. When the minimum distance from the front surface of the first conductors 11 to the rear surface of the protective film 40 exceeds the upper limit, the different-pitch flat cable connection structure may be unnecessarily thick. The lower limit of the minimum distance from the front surface of the first conductors 11 to the rear surface of the protective film 40 is preferably 3 μm and preferably 5 μm. When the minimum distance from the front surface of the first conductors 11 to the rear surface of the protective film 40 is less than the lower limit, the amount of adhesive provided is small and thus the different-pitch flat cable connection structure may have an insufficient adhesive strength.

<Reinforcement Film>

The reinforcement film 50 is a sheet-like member having flexibility and electrical insulating property and laminated on the rear surface side of the connection sheet 30 with the reinforcement film adhesive layer 51 therebetween. This reinforcement film 50 ensures a mechanical strength between the first flat-cable part 10 and the second flat-cable part 20 in the different-pitch flat cable connection structure, thereby preventing breakage of the first conductors 11, the second conductors 21, and the third conductors 32 and ensuring electrical connection. In particular, the reinforcement film 50 contributes to prevent the third conductors 32 formed by solidifying a printed conductive paste from fracturing by deformation of the base layer 31.

Specifically, a resin film can be used as the reinforcement film 50. For example, a polyimide resin, a polyethylene terephthalate resin, or the like is suitably used as the material of the resin film.

The lower limit of a softening temperature of the reinforcement film 50 is preferably 100° C., more preferably 110° C., and still more preferably 120° C. When the softening temperature of the reinforcement film 50 is less than the lower limit, the reinforcement film 50 may be softened and deformed during thermocompression bonding of the different-pitch flat cable connection structure. The upper limit of the softening temperature of the reinforcement film 50 is not particularly limited, but may be, for example, about 200° C.

The lower limit of a glass transition temperature of the reinforcement film 50 is preferably 50° C., more preferably 60° C., and still more preferably 65° C. When the glass transition temperature of the reinforcement film 50 is less than the lower limit, the reinforcement film 50 after thermocompression bonding of the different-pitch flat cable connection structure may have an insufficient strength. The upper limit of the glass transition temperature of the reinforcement film 50 is not particularly limited, but may be, for example, about 200° C.

The lower limit of an average thickness of the reinforcement film 50 is preferably 100 μm and more preferably 200 μm. When the average thickness of the reinforcement film 50 is less than the lower limit, it may be difficult to temporarily fix the connection sheet 30 etc. before thermocompression bonding of the different-pitch flat cable connection structure, and the effect of reinforcing the different-pitch flat cable connection structure may not be sufficiently obtained. The upper limit of the average thickness of the reinforcement film 50 is preferably 400 μm and more preferably 300 μm. When the average thickness of the reinforcement film 50 exceeds the upper limit, the different-pitch flat cable connection structure may be unnecessarily thick.

The length of the reinforcement film 50 in the conductor longitudinal direction is longer than the length of the connection sheet 30 in the conductor longitudinal direction. In this case, the connection sheet 30, the first flat-cable part 10, and the second flat-cable part 20 are fixed on a surface of the reinforcement film 50 (surface of the reinforcement film adhesive layer 51), and positioning of the connection sheet 30, the first flat-cable part 10, and the second flat-cable part 20 can be easily and reliably performed before thermocompression bonding.

The lower limit of a length of a lamination region of the reinforcement film 50 and the first flat-cable part 10 or the second flat-cable part 20 in the conductor longitudinal direction is preferably 1 mm and more preferably 1.5 mm. When the length of the lamination region in the conductor longitudinal direction is less than the lower limit, it may be difficult to temporarily fix the first flat-cable part 10 or the second flat-cable part 20 before thermocompression bonding of the different-pitch flat cable connection structure. In addition, the effect of reinforcing the different-pitch flat cable connection structure may not be sufficiently obtained. The upper limit of the length of the lamination region of the reinforcement film 50 and the first flat-cable part 10 or the second flat-cable part 20 in the conductor longitudinal direction is preferably 4 mm and more preferably 3 mm. When the length of the lamination region in the conductor longitudinal direction exceeds the upper limit, a thick part (reinforced part) of the different-pitch flat cable connection structure may be unnecessarily increased.

An adhesive constituting the reinforcement film adhesive layer 51 is not particularly limited, but an adhesive having good flexibility and good heat resistance is preferable. Examples of the adhesive include adhesives composed of a resin such as an epoxy resin, a polyimide resin, a polyester resin, a phenol resin, a polyurethane resin, an acrylic resin, a melamine resin, or a polyamide-imide resin. Among these, an adhesive composed of a thermoplastic resin having a lower softening temperature and a lower glass transition temperature than the reinforcement film 50 and the base layer 31 of the connection sheet 30 is preferable.

The lower limit of the softening temperature of the reinforcement film adhesive layer 51 is preferably 80° C., more preferably 90° C., and still more preferably 100° C. When the softening temperature of the reinforcement film adhesive layer 51 is less than the lower limit, the reinforcement film adhesive layer 51 may be softened and deformed in a thermocompression bonding step of the different-pitch flat cable connection structure. The upper limit of the softening temperature of the reinforcement film adhesive layer 51 is not particularly limited, but may be, for example, about 200° C.

The lower limit of the glass transition temperature of the reinforcement film adhesive layer 51 is preferably 50° C., more preferably 60° C., and still more preferably 70° C. When the glass transition temperature of the reinforcement film adhesive layer 51 is less than the lower limit, the different-pitch flat cable connection structure may have an insufficient strength after thermocompression bonding. The upper limit of the glass transition temperature of the reinforcement film adhesive layer 51 is not particularly limited, but may be, for example, about 200° C.

When the glass transition temperature of the reinforcement film adhesive layer 51 is less than the melting point of the conductive adhesive layers 33, the reinforcement film 50 can be attached to the rear surface of the connection sheet 30 in advance without melting the conductive adhesive layers 33 before the connection between the first flat-cable part 10 and the second flat-cable part 20.

The lower limit of an average thickness of the reinforcement film adhesive layer 51 is preferably 5 µm and more preferably 15 µm. When the average thickness of the reinforcement film adhesive layer 51 is less than the lower limit, the reinforcement film 50 may have an insufficient adhesive strength. The upper limit of the average thickness of the reinforcement film adhesive layer 51 is preferably 50 µm and more preferably 40 µm. When the average thickness of the reinforcement film adhesive layer 51 exceeds the upper limit, the different-pitch flat cable connection structure may be unnecessarily thick.

<Advantages>

According to the different-pitch flat cable connection structure, the first conductors 11 of the first flat-cable part 10 are connected to the second conductors 21 of the second flat-cable part 20 with the third conductors 32 of the connection sheet 30 therebetween, thus it provides a pitch-conversion flat cable that connects ends of the first conductors 11 and the second conductors 21, the ends being located on the side opposite to the third conductors 32, to electrical components. In the different-pitch flat cable connection structure, since the connection sheet 30 does not relate to the connection with other electrical components such as connectors, a high mechanical strength is not required for the connection sheet 30. In particular, it is sufficient that the third conductors 32 establish only electrical connection, and thus a mechanical strength is not substantially required. Therefore, the different-pitch flat cable connection structure can be formed at a relatively low cost.

Furthermore, since the third conductors 32 are formed by printing a conductive paste, the different-pitch flat cable connection structure is inexpensive, and in addition, has a high dimensional accuracy of the third conductors 32 that connect the first conductors 11 to the second conductors 21 and high reliability of electrical connection.

In the different-pitch flat cable connection structure, the third conductors 32 each have a simple shape that includes the rectangular first end portion 32a facing the first conductor 11 and having the conductive adhesive layer 33 thereon, the rectangular second end portion 32b facing the second conductor 21 and having the conductive adhesive layer 33 thereon, and the quadrangular connecting portion 32c connecting a side of the first end portion 32a to a side of the second end portion 32b. Therefore, the third conductors 32 can be easily designed and short-circuit between adjacent third conductors 32 is easily prevented.

In the different-pitch flat cable connection structure, since the conductive adhesive layers 33 are formed by printing a low-melting-point paste for electrical connection, the first conductors 11 and the second conductors 21 can be reliably connected to the third conductors 32 without damaging other components such as the third conductors 32.

In the different-pitch flat cable connection structure, since the front surface side of the first conductors 11 and the second conductors 21 is covered with the protective film 40 with the protective film adhesive layer 41 therebetween, insulating coating of the first conductors 11, the second conductors 21, and the third conductors 32 can be easily performed.

In the different-pitch flat cable connection structure, the rear surface side of the connection sheet 30 is covered with the reinforcement film 50 with the reinforcement film adhesive layer 51 therebetween. Accordingly, stable lamination and bonding of components can be performed in a state where the first flat-cable part 10, the second flat-cable part 20, and the connection sheet 30 are fixed to the reinforcement film 50.

<Pitch-Conversion Flat Cable>

In a pitch-conversion flat cable having the different-pitch flat cable connection structure, first conductors 11 of a first flat-cable part 10 and second conductors 21 of a second flat-cable part 20 are connected through third conductors 32 of a connection sheet 30. That is, the pitch-conversion flat cable includes a first flat-cable part 10 that includes a plurality of first conductors 11, a second flat-cable part 20 that include a plurality of second conductors 21, a connection sheet 30 that is laminated on the rear surface side of ends of the first conductors 11 and ends of the second conductors 21, a protective film 40 that covers the front surface side of the first conductors 11 and the second conductors 21, and a reinforcement film 50 that covers the rear surface side of the connection sheet 30. The pitch-conversion flat cable can be provided at a low cost and has good producibility and good reliability.

<Method for Producing Pitch-Conversion Flat Cable>

The pitch-conversion flat cable can be easily and reliably produced by a production method including the following steps:

(1) a step of exposing both surface sides of ends of first conductors 11 of a first flat-cable part 10 and ends of second conductors 21 of a second flat-cable part 20;

(2) a step of laminating a connection sheet 30 on a front surface of a reinforcement film 50;

(3) a step of fixing the first flat-cable part 10 and the second flat-cable part 20 to the reinforcement film 50 so that the first conductors 11 and the second conductors 21 are superposed on the connection sheet 30;

(4) a step of thermocompression-bonding the first conductors 11 and the second conductors 21 to third conductors 32; and (5) a step of laminating a protective film 40 on a front surface side of the first conductors 11 and the second conductors 21.

<(1) Step of Exposing First Conductors and Second Conductors>

In the step of exposing first conductors and second conductors, insulating films 13 on an end of the first flat-cable part 10 are detached and an adhesive on both surface sides of the first conductors 11 is further removed. Thus, both surface sides of each of the first conductors 11 are exposed. The same operation is performed in the second flat-cable part 20 to expose both surface sides of each of the second conductors 21. Note that, in the production of the first flat-cable part 10 and the second flat-cable part 20, each of the first flat-cable part 10 and the second flat-cable part 20 may be covered with insulating films such that the conductors of the ends are exposed in advance. Alternatively, the step of exposing the first conductors and the second conductors may be performed after the step of laminating a connection sheet described below. Furthermore, projections may be formed by the stamping molding method at positions where the exposed first conductors 11 and second conductors 21 face the third conductors.

<(2) Step of Laminating Connection Sheet>

Figure 8:
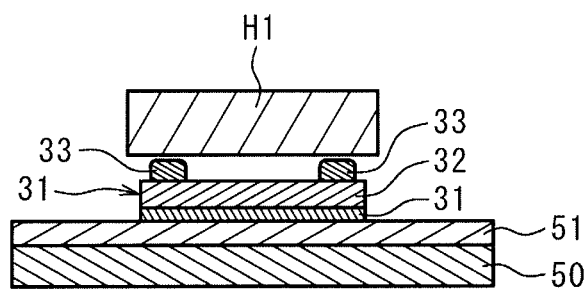
FIG. 8 is a schematic cross-sectional view showing a first step of a method for producing the pitch-conversion flat cable having the different-pitch flat cable connection structure in FIG. 1.

In the step of laminating a connection sheet, as shown in FIG. 8, a connection sheet 30 is laminated on a central part of a front surface of a reinforcement film 50 (front surface of a reinforcement film adhesive layer 51) in the longitudinal direction such that a base layer 31 is located on the rear surface side, and, for example, a heating unit H1 is pressed on a front surface of the connection sheet 30 to soften the reinforcement film adhesive layer 51. Thus, the connection sheet 30 is temporarily fixed on the reinforcement film 50. The heating with the heating unit H1 is conducted under the conditions that the temperature of the reinforcement film adhesive layer 51 becomes equal to or more than a glass transition temperature thereof (for example, 70° C.) and the base layer 31 of the connection sheet 30 is maintained at a temperature equal to or less than a softening temperature thereof (for example, 120° C.). For example, the temperature of the heating unit H1 is 80° C. or more and 100° C. or less, the contact pressure of the heating unit H1 is 0.5 MPa or more and 5 MPa or less, and the pressing time of the heating unit H1 is 1 second or more and 30 seconds or less. The heating unit H1 preferably has a cushioning material, for example, a polytetrafluoroethylene sheet or the like on a surface thereof so that the heating unit H1 is not fusion-bonded to the reinforcement film adhesive layer 51 etc.

<(3) Step of Fixing First Flat-Cable Part and Second Flat-Cable Part>

Figure 9:
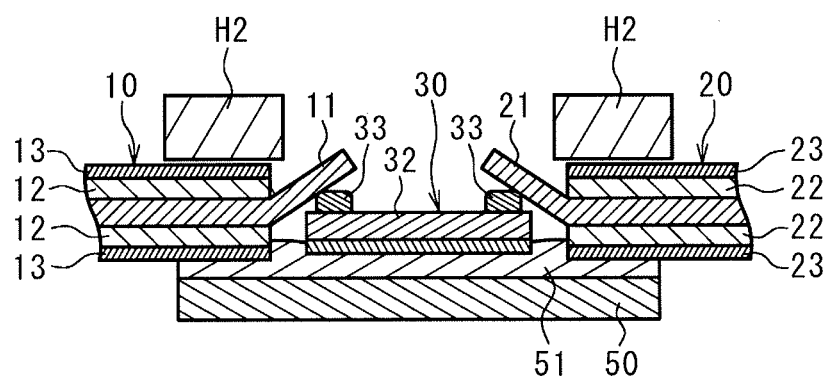
FIG. 9 is a schematic cross-sectional view showing a step of the method for producing the pitch-conversion flat cable having the different-pitch flat cable connection structure in FIG. 1, the step being subsequent to the step shown in FIG. 8.

In the step of fixing the first flat-cable part and the second flat-cable part, as shown in FIG. 9, the first flat-cable part 10 and the second flat-cable part 20 are arranged on the reinforcement film 50 so that the first conductors 11 and the second conductors 21 are respectively superposed on first end portions 32a and second end portion 32b of the third conductors 32 of the connection sheet 30. Subsequently, a heating unit H2 is pressed on surfaces of a portion of the insulating film 13 of the first flat-cable part 10, the portion being located on the reinforcement film 50, and a portion of the insulating film 23 of the second flat-cable part 20, the portion being located on the reinforcement film 50. Thus, the reinforcement film adhesive layer 51 is softened to fix the first flat-cable part 10 and the second flat-cable part 20 to the reinforcement film 50. The heating with the heating unit H2 is conducted under the conditions that the temperature of the reinforcement film adhesive layer 51 becomes equal to or more than the glass transition temperature thereof (for example, 70° C.) and the insulating films 13 of the first flat-cable part 10 and the insulating films 23 of the second flat-cable part 20 are maintained at a temperature equal to or less than a softening temperature thereof (for example, 120° C.). For example, the temperature, the contact pressure, and the pressing time of the heating unit H2 may be the same as those of the heating unit H1 used in the step of laminating the connection sheet. The heating unit H2 also preferably has a cushioning material on a surface thereof.

<(4) Step of Thermocompression-Bonding First Conductors and Second Conductors>

Figure 10:
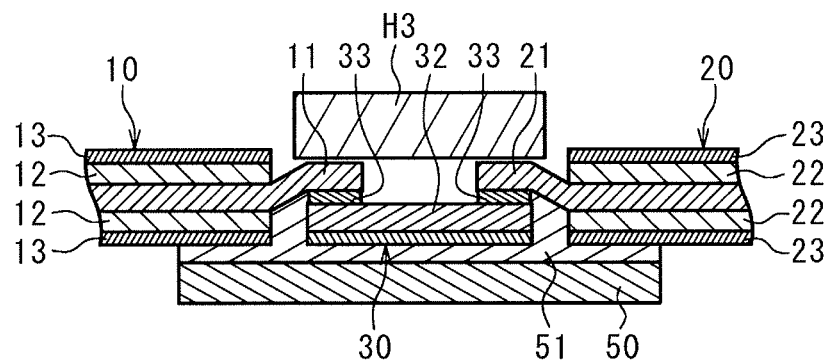
FIG. 10 is a schematic cross-sectional view showing a step of the method for producing the pitch-conversion flat cable having the different-pitch flat cable connection structure in FIG. 1, the step being subsequent to the step shown in FIG. 9.

In the step of thermocompression-bonding the first conductors and the second conductors, as shown in FIG. 10, a heating unit H3 is pressed on exposed surfaces of the first conductors 11 and the second conductors 21 to electrically connect the first conductors 11 and second conductors 21 to the third conductors 32 with conductive adhesive layers 33 therebetween. The heating with the heating unit H3 is conducted under the conditions that the temperature of the conductive adhesive layers 33 becomes equal to or more than a functional temperature (for example, 139° C.) at which the conductive adhesive layers 33 can exhibit a conductive adhesion performance, and the base layer 31 of the connection sheet 30 is maintained at a temperature equal to or less than the softening temperature thereof (for example 120° C.). For example, the temperature of the heating unit H3 is 145° C. or more and 155° C. or less, the contact pressure of the heating unit H3 is determined so that a pressure of 2 N or more and 8 N or less is applied per third conductor 32, and the pressing time of the heating unit H3 is 1 second or more and 30 seconds or less. The heating unit H3 also preferably has a cushioning material on a surface thereof.

<(5) Step of Laminating Protective Film>

Figure 11:
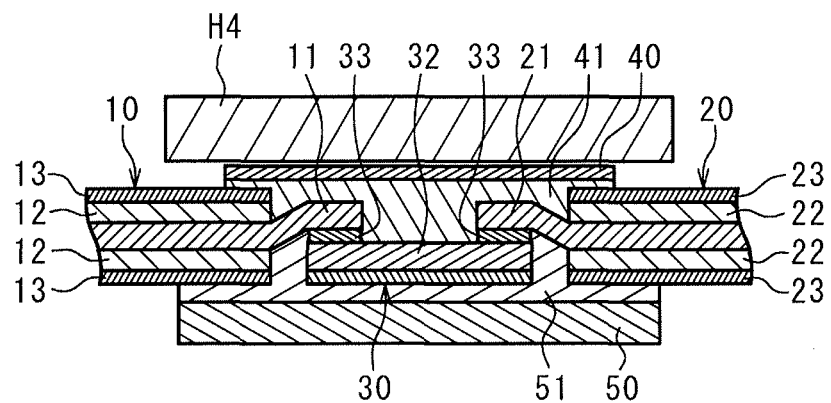
FIG. 11 is a schematic cross-sectional view showing a last step of the method for producing the pitch-conversion flat cable having the different-pitch flat cable connection structure in FIG. 1.

In the step of laminating a protective film, as shown in FIG. 11, a protective film 40 having a protective film adhesive layer 41 on a rear surface thereof is laminated on the front surface side of the first conductors 11 and the second conductors 21. Subsequently, a heating unit H4 is pressed on the front surface side of the protective film 40 to soften the protective film adhesive layer 41 and the reinforcement film adhesive layer 51. Thus, the first flat-cable part 10, the second flat-cable part 20, the connection sheet 30, the protective film 40, and the reinforcement film 50 are integrally connected. The heating with the heating unit H4 is conducted under the conditions that the temperature of the protective film adhesive layer 41 becomes equal to or more than a glass transition temperature thereof (for example, 70° C.), the protective film 40 is maintained at a temperature equal to or less than a softening temperature thereof (for example, 120° C.), and the insulating films 13 of the first flat-cable part 10 and the insulating films 23 of the second flat-cable part 20 are maintained at a temperature equal to or less than the softening temperature thereof (for example, 120° C.). For example, the temperature of the heating unit H4 is 80° C. or more and 100° C. or less, the contact pressure of the heating unit H4 is 0.5 MPa or more and 5 MPa or less, and the pressing time of the heating unit H4 is 1 second or more and 30 seconds or less. The heating unit H4 also preferably has a cushioning material on a surface thereof.

[Other Embodiments]

It is to be understood that the embodiments disclosed herein are only illustrative and are not restrictive in all respects. The scope of the present invention is not limited to the configurations of the embodiments but is defined by the claims described below. It is intended that the scope of the present invention includes equivalents of the claims and all modifications within the scope of the claims.

Figure 12:
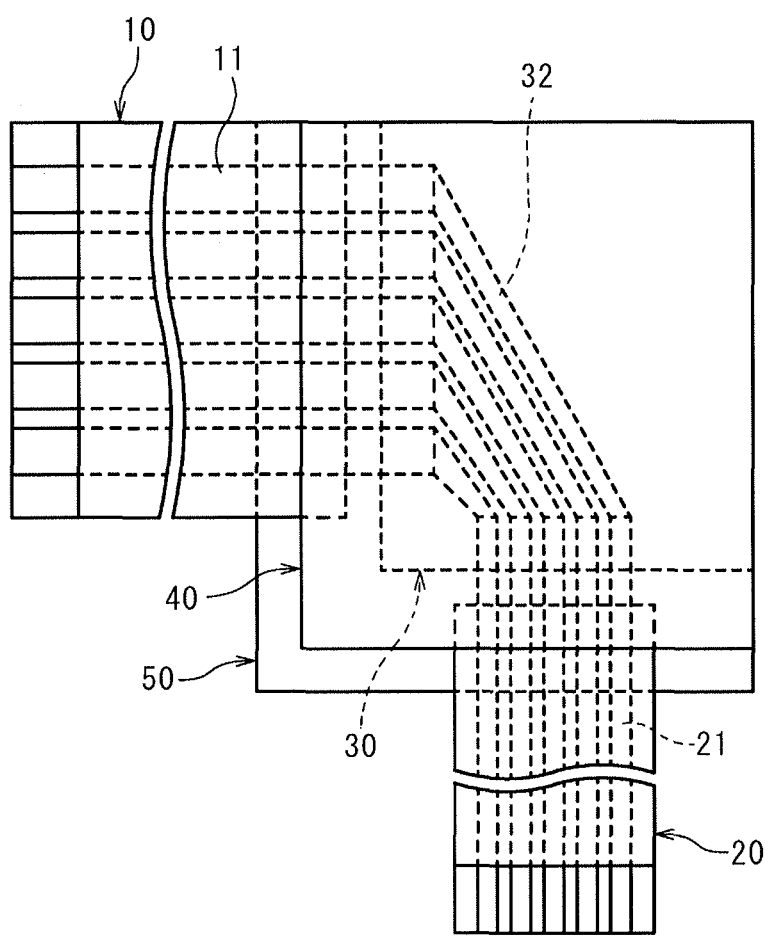
FIG. 12 is a schematic plan view showing a pitch-conversion flat cable having a different-pitch flat cable connection structure according to an embodiment different from the different-pitch flat cable connection structure in FIG. 1.

For example, as in the different-pitch flat cable connection structure of another embodiment shown in FIG. 12, an extension direction of first conductors of a first flat-cable part and an extension direction of second conductors of a second flat-cable part may form any angle. With regard to the embodiment shown in FIG. 12, components the same as those in the embodiment shown in FIG. 1 are assigned the same reference numerals, and an overlapping description thereof is omitted.

Also in the embodiment shown in FIG. 12, connecting portions 32c of third conductors 32 each have a quadrangular shape connecting a side of a first end portion 32a to a side of a second end portion 32b. However, the connecting portions of the third conductors 32 may be curved or bent as long as the connecting portions are insulated from each other.

In the connection sheet, gaps between the third conductors may be filled with an adhesive by a printing method or the like. In this case, the adhesive strength of the connection sheet can be enhanced. Furthermore, in such a case, the reinforcement film can be omitted. That is, the reinforcement film is not an essential component of the present invention. A different-pitch flat cable connection structure that achieves the advantages of the present invention can be obtained without providing the reinforcement film.

The insulating film on the front surface side of the first flat-cable part and the second flat-cable part (the side being opposite to the surface facing the connection sheet) may be left, and lamination of the protective film may be omitted.

Furthermore, a different-pitch flat cable connection structure in which the width of each of the first conductors of the first flat-cable part is equal to the width of each of the second conductors of the second flat-cable part is also within the scope intended by the present invention.

The plating on the first conductors, the second conductors, and the third conductors is not essential, and conductors that do not include a plating layer may be used.

INDUSTRIAL APPLICABILITY

The different-pitch flat cable connection structure of the present invention can be formed at a low cost, and has good adhesive strength and good reliability of electrical connection. The pitch-conversion flat cable of the present invention can connect electrical components having different terminal pitches at a low cost, and has good producibility and good connection reliability.

The invention claimed is:

1. A different-pitch flat cable connection structure for connecting a first flat-cable part that includes a plurality of first conductors arranged in a stripe pattern with a first pitch to a second flat-cable part that includes a plurality of second conductors arranged in a stripe pattern with a second pitch smaller than the first pitch, and establishing electrical continuity between the first conductors and the second conductors, the different-pitch flat cable connection structure comprising:
 a connection sheet laminated on one surface side of ends of the first conductors and ends of the second conductors in which at least the one surface side of the ends is exposed,
 wherein the connection sheet includes
 a base layer,
 a plurality of third conductors laminated on another surface side of the base layer so as to extend between the first conductors and the corresponding second conductors in a one-to-one relationship, and
 a plurality of conductive adhesive layers disposed between facing surfaces of the first conductors and the third conductors and between facing surfaces of the second conductors and the third conductors.

2. The different-pitch flat cable connection structure according to claim 1, wherein the third conductors are formed by printing a conductive paste.

3. The different-pitch flat cable connection structure according to claim 1, wherein each of the third conductors has a rectangular first end portion facing the first conductor and having the conductive adhesive layer thereon, a rectangular second end portion facing the second conductor and having the conductive adhesive layer thereon, and a quadrangular connecting portion connecting a side of the first end portion to a side of the second end portion.

4. The different-pitch flat cable connection structure according to claim 1, wherein the conductive adhesive layers are formed by printing a solder paste that contains a metal having a low melting point.

5. The different-pitch flat cable connection structure according to claim 1,
 wherein both surfaces of the first conductors are exposed on an end of the first flat-cable part,
 both surfaces of the second conductors are exposed on an end of the second flat-cable part, and
 a protective film is provided on the another surface side of the first conductors and the second conductors so as to cover the connection sheet with an adhesive layer therebetween.

6. The different-pitch flat cable connection structure according to claim 1, wherein a reinforcement film is provided on the one surface side of the connection sheet with an adhesive layer therebetween.

7. The different-pitch flat cable connection structure according to claim 3, wherein the first conductors and the second conductors each have a projection projecting so as to face the first end portion of the third conductor and the second end portion of the third conductor, respectively, and the conductive adhesive layer fills a gap between the projection and the third conductor.

8. The different-pitch flat cable connection structure according to claim 7, wherein the projection is formed so as to have a spherical surface by a stamping molding method for a sheet-shaped conductor.

9. The different-pitch flat cable connection structure according to claim 8, wherein an average projection height of the projection is 0.06 mm or more and 0.2 mm or less.

10. The different-pitch flat cable connection structure according to claim 9, wherein an average radius of curvature of an inner surface of the projection is 0.1 mm or more and 0.5 mm or less.

11. A pitch-conversion flat cable comprising a first flat-cable part that includes a plurality of first conductors arranged in a stripe pattern with a first pitch and a second flat-cable part that includes a plurality of second conductors arranged in a stripe pattern with a second pitch smaller than the first pitch,
 the first flat-cable part and the second flat-cable part being connected to each other so as to establish electrical continuity between the first conductors and the corresponding second conductors in a one-to-one relationship,
 wherein a connecting part between the first flat-cable part and the second flat-cable part has the different-pitch flat cable connection structure according to claim 1.

12. The pitch-conversion flat cable according to claim 11, wherein an extension direction of the first conductors of the first flat-cable part and an extension direction of the second conductors of the second flat-cable part form an angle.

13. A method for producing a pitch-conversion flat cable including a first flat-cable part that includes a plurality of first conductors arranged in a stripe pattern with a first pitch and a second flat-cable part that includes a plurality of second conductors arranged in a stripe pattern with a second pitch smaller than the first pitch, the first conductors and the corresponding second conductors establishing electrical continuity in a one-to-one relationship, the method comprising:
 a step of superposing a connection sheet on one surface side of the first conductors and the second conductors; and
 a step of compression-bonding the first conductors and the second conductors to the connection sheet,
 wherein the connection sheet includes
 a base layer,
 a plurality of third conductors that are laminated on another surface side of the base layer so as to extend between the first conductors and the second conductors, and
 a plurality of conductive adhesive layers disposed between facing surfaces of the first conductors and the third conductors and between facing surfaces of the second conductors and the third conductors.

* * * * *